July 19, 1966 M. J. LANGAN 3,262,062

DIRECT CURRENT AMPLIFIER OF THE TYPE COMPRISING TWO CASCADED TRANSISTORS IN SERIES WITH A THIRD TRANSISTOR

Filed April 10, 1963 2 Sheets-Sheet 1

INVENTOR.
MARION J. LANGAN
BY Alden D. Redfield
Charles M. Hogan
ATTORNEYS.

INVENTOR.
MARION J. LANGAN
BY Alden D. Redfield
Charles M. Hogan
ATTORNEYS.

United States Patent Office 3,262,062
Patented July 19, 1966

3,262,062

DIRECT CURRENT AMPLIFIER OF THE TYPE COMPRISING TWO CASCADED TRANSISTORS IN SERIES WITH A THIRD TRANSISTOR

Marion J. Langan, Cincinnati, Ohio, assignor to Avco Corporation, Cincinnati, Ohio, a corporation of Delaware Filed Apr. 10, 1963, Ser. No. 272,041
8 Claims. (Cl. 330—17)

The present invention relates to transistorized direct-coupled amplifiers, and it provides a stabilized amplifier for operation from direct currents into the megacycle region.

Alternating current amplifiers or choppers usually are selected as the practical choice in many applications where pure direct current amplifiers are highly desirable. Such circuitry affords some relief from drift and certain other difficult problems encountered with direct current circuitry and usually is preferred for reliable operation.

The direct current amplifier common to the art makes no significant distinction between signal and bias voltage changes, and stability of drive voltages, a fundamental requirement, is difficult to achieve.

An object of the present invention is to provide a direct current amplifier which is relatively insensitive to power supply and temperature irregularities, and free from the above-mentioned limitations of the prior art.

Other objects of the invention are to provide a direct-coupled amplifier having these characteristics:

Simplicity of semiconductor circuitry;
Predictable gain dependent upon firm impedance ratios;
Automatic regulation;
Nominally zero volt input and output;
High input impedance;
High order signal linearity.

In accordance with an illustrative embodiment of the invention, there is provided, in combination, a direct current amplifier comprising a first transistor of a selected type; a second transistor of complementary type; means for directly coupling the first and second transistors in cascaded relationship; and a third transistor of the same type as the second transistor; each of said transistors having an emitter and a base and a collector, the emitter-collector circuits of the first and third transistors being connected in series, and the emitter-collector circuits of the second and third transistors being connected in series.

Figures 1, 7:
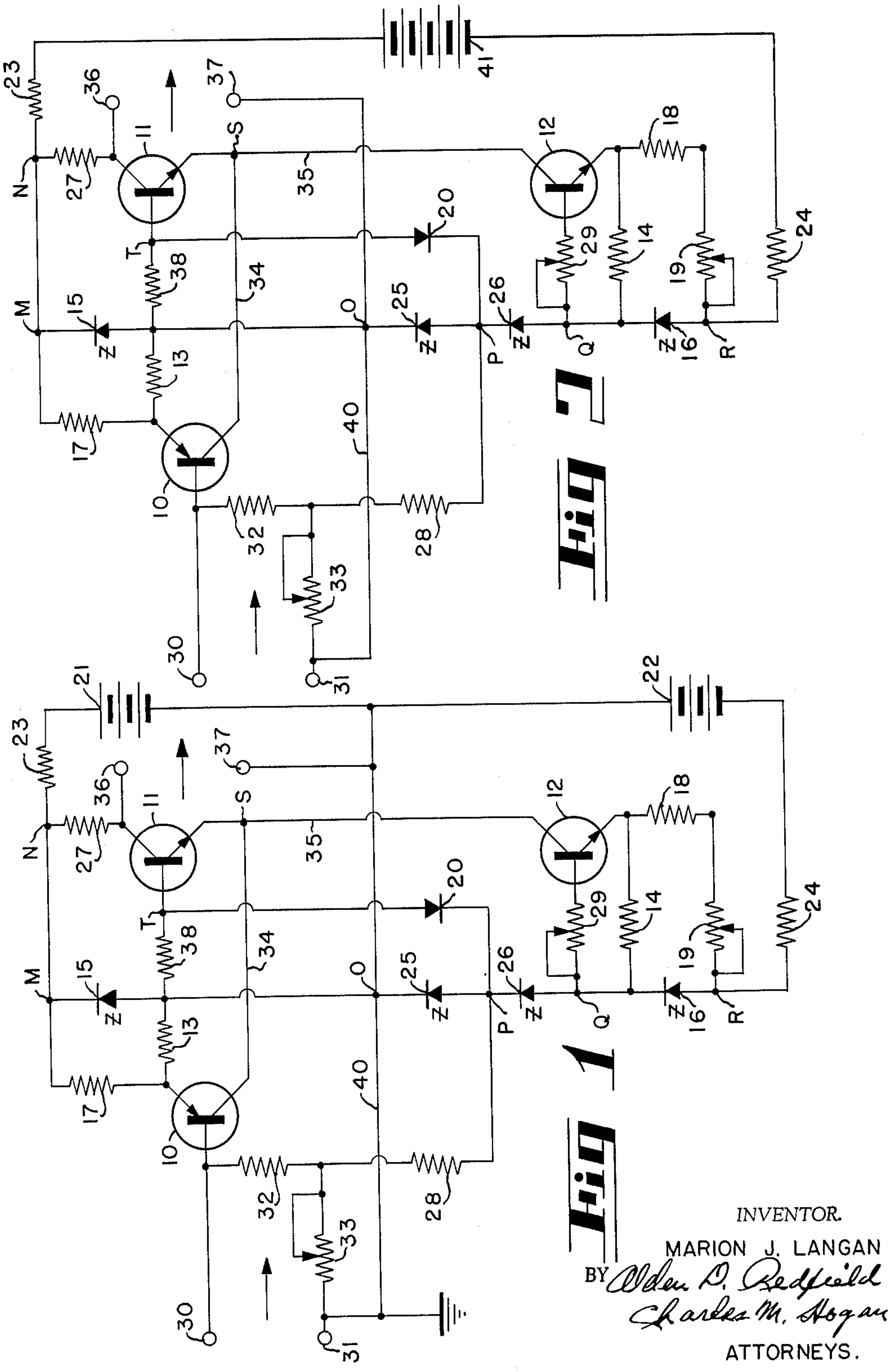
Figure 3:
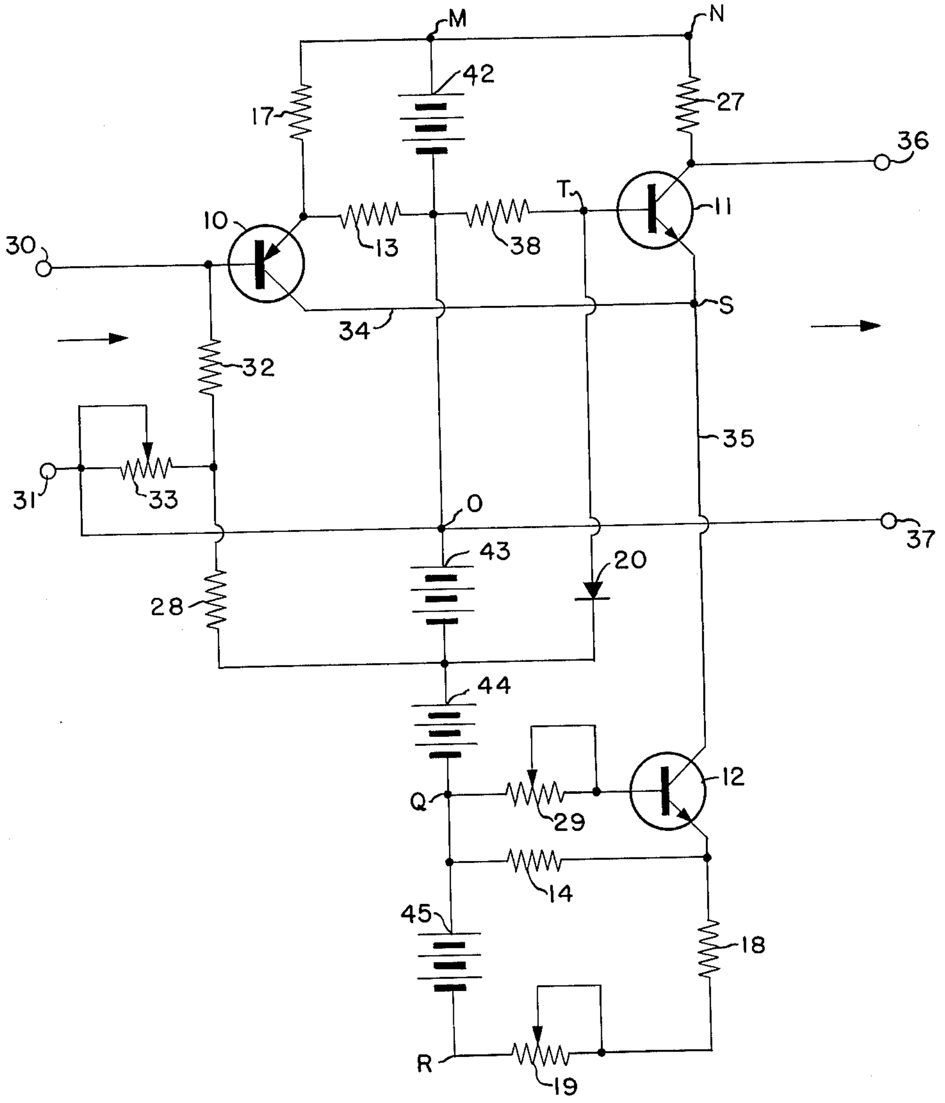

For a better understanding of the present invention, together with other and further objects, advantages, and capabilities thereof, reference is made to the following description of the accompanying drawings, all of which are circuit schematics, FIG. 1 showing the preferred embodiment of the invention, FIG. 2 another embodiment constituting a floating arrangement, and FIG. 3 a third embodiment in which batteries are substituted for a stabilized diode voltage-regulating chain.

Referring now specifically to FIG. 1, there is illustrated a preferred embodiment of the invention. In the following description, suitable circuit parameters of this amplifier are given parenthetically by way of illustration and not of limitation. The FIG. 1 embodiment comprises a transistor 10 (PNP, type 2N1309), a transistor 11 (NPN, type 2N1308), a transistor 12 (NPN, type 2N1308), and associated circuitry now detailed. Attention is now directed to several novel features of this arrangement.

First, the emitter-collector circuits of transistors 10 and 11 are in series with the emitter-collector circuit of transistor 12. Transistor 12 is a constant-current device and is the source of curent flow through both transistors 10 and 11, so that the aggregate current flow through transistors 10 and 11 remains substantially constant, any changes in the current flow through transistor 10 being automatically accompanied by compensatory changes in the current through transistor 11.

Second, the biasing system for the base of transistor 10 includes means for providing a bucking bias, so that the base of transistor 10 is maintained at substantially zero volts relative to ground.

Third, resistor 13 (560 ohms), connected between the emitter of transistor 10 and ground, forms a voltage divider in conjunction with resistor 17 (2700 ohms) across zener diode 15, and is so proportioned that the junction of transistor 10 "looks into" an impedance and voltage source that permits a minimum steady-state emitter current with a maximum linear collector current change in response to base input signals.

Fourth, to the fullest extent practicable, the characteristics of the following elements correspond:

Resistor 13 and resistor 14;
Zener diode 15 and zener diode 16;
Emitter load resistor 17 and the combination of resistor 18 and rheostat 19;
Transistor 10 and transistor 12.

Fifth, the collector output of transistor 10 "looks into" a low impedance input at transistor 11 and a high impedance input at transistor 12.

Sixth, the function of diode 20 is to provide compensation by creating a change in the base voltage of transistor 11 in response to temperature variations, in order to cancel the voltage changes which would otherwise occur at the emitter of transistor 11 due to variations in the base-to-emitter junction voltage of transistor 11.

Seventh, zener diodes 15, 25, 26, and 16 are voltage stable with temperature to the fullest extent practicable.

Eighth, elements producing complementary compensating effects are mounted in common heat sinks which preclude relative temperature variations.

Emphasis is directed to the foregoing features, in combination.

A source of current is provided by batteries 21 (20 volts) and 22 (30 volts). These batteries are arranged in series with each other and in series with resistor 23 (1500 ohms), resistor 24 (1300 ohms), and a voltage divider chain comprising zener diodes 15, 25, 26, and 16 (each type 1N429), in such fashion as to establish stabilized voltages at the following points:

M, high potential terminal of resistor 17 (+6 volts);
N, high potential terminal of resistor 27 (+6 volts);
O, ground (0 volts);
P, low potential terminal of diode 20 (−6 volts);
Q, low potential terminal of rheostat 29 (−12 volts);
R, low potential terminal of resistance 18, 19 (−18 volts).

It will be understood that the resistors 23 and 24 and batteries 21 and 22 may be omitted, and batteries 42, 43, 44, and 45 can be substituted in the positions of the zener diodes 15, 25, 26, and 16, as indicated in FIG. 3. In the battery configuration, resistors 13 and 14 may be omitted to advantage and resistors 17, 18, and 19 reduced in value, particularly where small battery voltages (in the vicinity of 1 volt) are employed. Elimination of resistors 13 and 14 reduces battery drain. Further, a single battery 41 may be used in an alternative embodiment (FIG. 2) which floats (i.e., 31, 40, 37 not grounded).

That portion of the discussion relating to the current sources being concluded, the description now proceeds to the details of the circuitry immediately associated with transistor 10 (FIG. 1).

Transistor 10 is set up in the common-emitter configuration, input signal being applied to its base and output signal being taken from its collector, so that the voltage at the emitter will follow very closely the signal input voltage. The signal input circuit comprises a high potential terminal 30 and a low potential terminal 31, the latter being grounded in FIG. 1, the conductor 40 indicating a ground connection. Terminal 30 is connected to the base of transistor 10. Between that base and ground there is connected a series combination of a resistor 32 (10,000 ohms) and a rheostat 33 (500 ohms maximum) in order to oppose and reduce to zero the bias developed across resistance 32, 33 by signal conduction in the base-emitter junction of transistor 10. The junction of the elements 32 and 33 is accordingly connected through resistor 28 (10,000 ohms) to point P (−6 volts). The emitter load resistor 17 (2700 ohms) is connected between the emitter of transistor 10 and point M (+6 volts), so that, assuming the parameters given, the emitter of transistor 10 is at approximately 0.5 volt. Connected between the last-mentioned emitter and ground is a resistance 13 (560 ohms) proportioned as indicated above to maintain collector current proportional to input voltage. The voltage divider chain across the current sources stabilizes the fixed biases provided for transistor 10.

Next the description relates to the transistor 11 (FIG. 1), which is set up in the common-base configuration. The output of transistor 10 is applied, via conductor 34, to a conductor 35 connected between the emitter of transistor 11 and the collector of transistor 12, the constant-current device 12 appearing (at point S) as a very high impedance, and transistor 11 presenting a very low impedance, so that on the order of 99% of the currents from line 34 flow through collector load resistor 27 (51,000 ohms) of transistor 11.

It is noted at this point that, assuming the parameters given, the potential at point S (i.e., the emitter of transistor 11) is at approximately −6 volts, and the potential at point T (i.e., the base of transistor 11) is at approximately −5.5 volts, there being a half volt drop across diode 20.

Diode 20 is operated with forward current through resistor 38. Its action is to create a forward voltage drop that varies with temperature in the same direction and magnitude as the emitter-to-base junction voltage of transistor 11. The voltage at the junction of the three transistors (emitter of transistor 11) is established by the base voltage of transistor 11 minus the base-to-emitter junction voltage of transistor 11. The voltage at the base of transistor 11 is established by the voltage at the junction of zener diodes 25 and 26 plus the forward voltage drop of diode 20. Assuming a steady voltage at the junction of diodes 25 and 26, an increase in diode 20 forward voltage drop will produce an increase in the base voltage of transistor 11, but an equivalent increase in the base-to-emitter junction voltage of transistor 11 maintains a stable voltage at the emitter of transistor 11 and accordingly a stable current through load resistance 27.

The final output from the FIG. 1 embodiment is taken from high potential output terminal 36, connected to the collector of transistor 11, and low potential output terminal 37, connected to ground. The base of transistor 11 is returned to ground through resistor 38 (6800 ohms) to complete the return path for base current.

The detailed description now turns to the constant-current transistor 12 (FIG. 1), which is arranged in the common-emitter configuration and circuit-wise closely resembles the circuitry of transistor 10. It has been noted that the collector has been connected to point S (−6 volts). The emitter is at −12.5 volts. The emitter load resistance comprises, in series, a resistor 18 (2400 ohms) and a rheostat 19 (500 ohms maximum). Zener diode 16 resembles diode 15 in circuit configuration, in that it is connected between the emitter load resistance (i.e., point R) of transistor 12 and the point Q, to which the base of transistor 12 is returned, these points being 6 volts apart in potential. The base of the constant-current transistor 12 is returned to point Q (−12 volts) through a rheostat 29 (10,000 ohms maximum).

Having covered the structural associations of the FIG. 1 circuit elements, the description now proceeds to operation. Signal voltages are applied directly to the base of the emitter-follower transistor 10. That transistor is an amplifier, and it drives the amplifying stage, including transistor 11, by collector output application into the base-emitter circuit of transistor 11. The output of transistor 11 is taken from its collector load at terminal 36. Transistors 10 and 11 are of opposite types compatible with transistor 12. In the FIG. 1 embodiment transistor 10 is a PNP, and transistors 11 and 12 are of the NPN type. It is, of course, within the teachings of the invention to provide an NPN type for transistor 10 and PNP types for transistors 11 and 12. A stiff emitter bias is applied to transistor 10 from source 21, and the base of transistor 10 is brought to zero bias relative to ground, the bias due to the static base junction current being bucked out by manual adjustment of rheostat 33.

The emitter-collector currents of both transistor 10 and transistor 11 flow through the collector-emitter circuit of transistor 12.

The regulator stage including transistor 12 functions as a constant-current device, so that an increase in the current through transistor 10 results in a corresponding decrease in the current through transistor 11, and conversely.

The emitter-collector impedances of transistors 10 and 12 vary with temperature in a manner to maintain the emitter voltage of transistor 11 and the collector current of transistor 11 constant. This control relationship is subject to manual adjustment of rheostat 29 in a vernier sense, for exactly matched conditions. The effective value of rheostat 29 may be adjusted, when transistors 10 and 12 are fully matched, with respect to the impedance of the signal input voltage, so that base current changes in transistors 10 and 12 produce exactly compensative voltages.

The junction voltage of diode 20 changes with temperature in a manner similar to the base-emitter voltage of transistor 11. That characteristic is used as auxiliary compensation toward maintenance of constant emitter voltage to transistor 11 and constant collector current in transistor 11.

The zener diodes 15, 25, 26, and 16 compensate for power supply variations in the circuits where fixed voltages are necessary to stable operation. These diodes are positioned for minimum cross interference and maximum stabilization correction toward minimal change in the output voltage. The use of zener diodes tends to maintain an absolutely constant voltage divider.

Now, since transistors 10 and 11 operate on a current sharing basis, current changes due to input signal are reflected directly as voltage changes in emitter resistors 17 and 13 in parallel, and collector resistor 27. Transistor 10, working against the stiff shunt, effects relatively small order voltage changes, while the voltage change in resistor 27 varies directly with the current. The gain, voltage-wise, is determined by the ratio of these voltage changes. Voltage gains in the order of 40 db are normal to the specific circuitry shown in FIG. 1.

Transistor 12 operates under a regulated fixed bias condition with sufficient collector-emitter current to maintain a steady dynamic impedance against signal intensity.

Signal linearity is achieved in this device without the usual feedback circuits and their related stability problems. The character of this direct-coupled circuitry makes it readily adaptable to relatively high impedance-high gain applications. A high order gain-bandwidth product is possible, limited mainly by the active semiconductor characteristics.

The amplifier of the present invention simultaneously provides ultra-linear signal reproduction and high voltage gains with a small number of components. While it is readily within the competence of the art to produce linearity—an emitter-follower has linearity but no voltage gain—or to produce large voltage gains—a transistor with a large collector resistor provides a large voltage gain but poor linearity—it is very difficult to accomplish both linearity and high order voltage gain simultaneously. This is believed to be the principal contribution of the present invention.

The present invention is useful in analog computers, servo mechanisms, strain gauges, and similar devices designed for use with means to amplify direct current and/or extremely low frequency voltages. The novel amplifier is useful also in very wide range frequency amplification—e.g., direct current to 10 megacycles in pass bandwidth.

It will be noted (FIG. 1) that the collector of transistor 11 is provided with a reverse bias from the positive terminal of source 21 via resistors 23 and 27. The emitter of transistor 12 is provided with forward bias by a connection, through resistance 18, 19, 24, to the negative terminal of source 22. The emitter-collector circuits of the transistors 11 and 12 are series-energized, and the transistors are of the same type. The potential at point S is −6 volts, indicating the forward bias on the emitter of transistor 11 and the reverse bias on the collector of transistor 12.

It will also be noted that forward bias is applied to the emitter of transistor 10 by its connection to the positive terminal of battery 21 through resistance 17, 23. The −6 volts potential at point S is also a measure of the reverse bias applied to the collector of transistor 10. Transistors 10 and 12 are also series-energized, but of opposite types. Note is further made of the fact that the bases of transistors 11 and 12 are returned to a diode-stabilized voltage divider.

Now, the relationship between the transistor stages inclusive of transistors 10 and 11 is described as a direct coupling of complementary transistors. Thus it will be seen that the invention provides, in combination, a direct current amplifier comprising a first transistor of a selected type; a second transistor of complementary type; means for directly coupling the first and second transistors in cascaded relationship; and a third transistor of the same type as the second transistor; each of said transistors having an emitter and a base and a collector, the emitter-collector circuits of the first and third transistors being connected in series, and the emitter-collector circuits of the second and third transistors being connected in series. The invention further provides a combination in which a common source of bias potential is connected across both of said series arrangements.

The description of FIG. 1 having been completed, attention is now invited to FIG. 2, in which a single battery 41 is substituted for the two batteries 21 and 22 and in which the negative terminal conductor 40 floats, being ungrounded.

In the FIG. 3 embodiment the batteries 42, 43, 44, and 45 are substituted for the diodes 15, 25, 26, and 16.

While there have been shown and described what are considered to be the preferred embodiments of the present invention, it will be understood by those skilled in the art that various modifications and changes may be made therein without departing from the scope of the invention as defined by the appended claims.

I claim:

1. In a direct current amplifier, the combination of:
a first transistor of one conductivity type;
a second transistor of the complementary conductivity type;
a third transistor of the same conductivity type as the second;
each of said transistors having a base and an emitter and a collector;
conductive connections between the collector of the first transistor and the emitter of the second transistor and the collector of the third transistor, whereby the electrical path defined by the emitter and collector of the first transistor and the electrical path defined by the collector and emitter of the second transistor are in series with the electrical path defined by the collector and emitter of the third transistor, so that the first and third transistors are in complementary symmetry;
means for providing energy comprising a potential divider having end terminals of opposite polarity and a reference potential tap and a first intermediate potential tap;
first and second resistors connected between the bases of the first and second transistors, respectively, and said reference potential tap;
a third resistor connected between the base of the third transistor and said intermediate potential tap;
fourth and fifth resistors respectively connecting the emitter of the first transistor and the collector of the second transistor to one of said end terminals;
and a sixth resistor connecting the emitter of the third transistor to the other of said end terminals;
said first intermediate potential tap being located between the reference potential tap and said other of said end terminals;
the base of said first transistor and said reference potential tap providing a signal input circuit, and the collector of said second transistor and said reference potential tap providing a signal output circuit, so that the first and second transistors are in the common-emitter to common-base cascade arrangement.

2. The combination in accordance with claim 1, and a seventh resistor connected between the first emitter and the reference potential tap and proportioned to permit, in the first transistor, large linear signal current changes with small steady-state emitter current.

3. The combination in accordance with claim 2 in which the potential divider comprises a chain of zener diodes, and the means for providing energy comprises a plurality of serially arranged current sources in parallel with said zener diodes.

4. The combination in accordance with claim 3 in which the reference potential tap is grounded and in which the current sources are two in number and have a junction connected to said reference potential tap.

5. The combination in accordance with claim 2 in which the potential divider comprises a second intermediate tap, located between the first intermediate potential tap and the reference potential tap, and a forward-connected diode connected between the base of said second transistor and said second intermediate tap for temperature-compensating emitter-base junction voltage drop in said second transistor.

6. The combination in accordance with claim 5 in which the first resistor comprises a pair of resistance elements having an interconnection, and an eighth resistor connected between said interconnection and said second intermediate tap.

7. In a direct current amplifier, the combination of:
a first transistor of PNP conductivity type;
a second transistor of the NPN conductivity type;
a third transistor of the same NPN conductivity type as the second;
each of said transistors having a base and an emitter and a collector;
conductive connections between the collector of the first transistor and the emitter of the second transistor and the collector of the third transistor, whereby the electrical path defined by the emitter and collector of the first transistor and the electrical path defined by the collector and emitter of the second transistor are in series with the electrical path defined by the collector and emitter of the third transistor, so that the first and third transistors are in complementary symmetry;

means for providing energy comprising a potential divider having a positive potential terminal and a negative potential terminal and a reference potential tap and a less negative potential tap;

first and second resistors connected between the bases of the first and second transistors, respectively, and said reference potential tap;

a third resistor connected between the base of the third transistor and said less negative potential tap;

fourth and fifth resistors respectively connecting the emitter of the first transistor and the collector of the second transistor to said positive potential terminal;

and a sixth resistor connecting the emitter of the third transistor to said negative voltage terminal;

the base of said first transistor and said reference potential tap providing a signal input circuit, and the collector of said second transistor and said reference potential tap providing a signal output circuit, so that the first and second transistors are in the common-emitter to common-base cascade arrangement.

8. In a direct current amplifier, the combination of:

a first transistor of a selected conductivity type;

a second transistor of complementary conductivity type;

a third transistor of the same conductivity type as said second transistor;

each of said transistors having an emitter and a collector and a base;

means including a first direct conductive connection between the collector of the first transistor and the emitter of the second transistor and coupling said first and second transistors in direct cascaded relationship;

a second direct conductive connection between the first direct conductive connection and the collector of the third transistor and connecting the collectors and emitters of the second and third transistors in series, whereby the collectors and emitters of the first and third transistors are also connected in series;

and means for biasing the third transistors so that it presents a high impedance at its collector and constitutes a constant current device.

References Cited by the Examiner

UNITED STATES PATENTS

| | | | |
|---|---|---|---|
| 3,003,108 | 10/1961 | Theile. | |
| 3,114,112 | 12/1963 | Cochran | 330—17 |
| 3,214,706 | 10/1965 | Mollinga | 330—22 |

ROY LAKE, *Primary Examiner.*

F. D. PARIS, *Assistant Examiner.*